Figure 1:
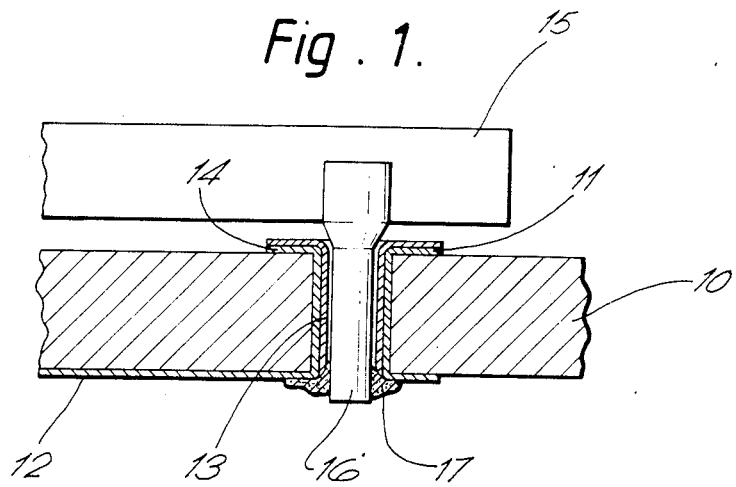

United States Patent [19]

Wilson

[11] Patent Number: 4,610,758

[45] Date of Patent: Sep. 9, 1986

[54] MANUFACTURE OF PRINTED CIRCUIT BOARDS

[75] Inventor: Geoffrey C. Wilson, Reading, England

[73] Assignee: Ferranti plc, Cheshire, England

[21] Appl. No.: 615,261

[22] Filed: May 30, 1984

[30] Foreign Application Priority Data

Jun. 1, 1983 [GB] United Kingdom ............... 8315010

[51] Int. Cl.⁴ .......................... B05D 5/12; C23F 1/02
[52] U.S. Cl. .................................. 156/656; 156/902; 427/97; 29/852; 428/901; 174/68.5
[58] Field of Search ............... 156/625, 656, 659.1, 156/902; 428/901; 427/96, 97, 98; 204/15, 32.1; 174/68.5; 29/847, 840, 843, 852, 837, 845

[56] References Cited

U.S. PATENT DOCUMENTS

| | | | |
|---|---|---|---|
| 3,236,708 | 2/1966 | Tillis | 204/15 X |
| 3,462,832 | 8/1969 | Kubik | 427/97 X |
| 3,702,284 | 11/1972 | Merkenschlager | 427/97 X |
| 4,024,631 | 5/1977 | Castillero | 204/32.1 X |
| 4,104,111 | 8/1978 | Mack | 156/656 |
| 4,285,991 | 8/1981 | Gedrat et al. | 29/852 |
| 4,512,829 | 4/1985 | Ohta et al. | 156/656 |

FOREIGN PATENT DOCUMENTS 54-157270 12/1979 Japan ..................... 427/97

Primary Examiner—Edward Kimlin
Assistant Examiner—Ramon R. Hoch
Attorney, Agent, or Firm—Larson and Taylor

[57] ABSTRACT

A method of manufacture of a printed circuit board having plated-through holes interconnecting printed conductors formed on each of two external surfaces, includes the step of masking those areas of the external surfaces where solder will subsequently be required to adhere. The unmasked conductive areas are then coated with a material which prevents wetting by normal soldering techniques. The masking material is subsequently removed. The coating material may be electroless nickel, or electroplated nickel or suitable nickel alloys.

7 Claims, 10 Drawing Figures

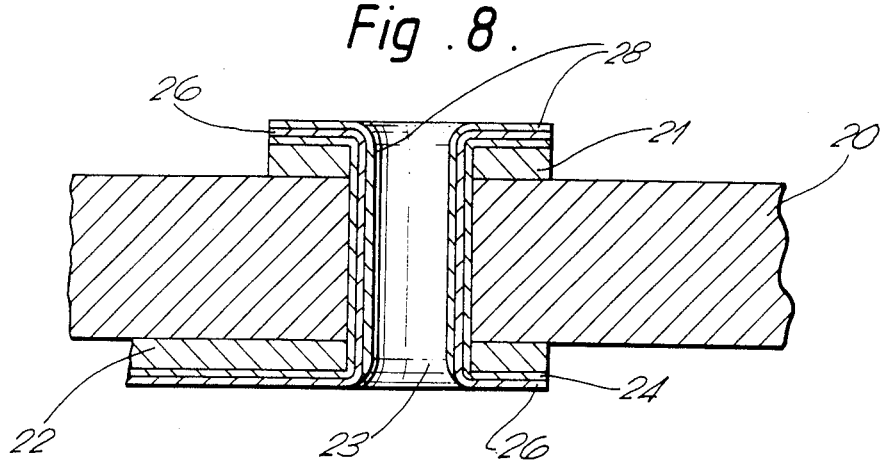
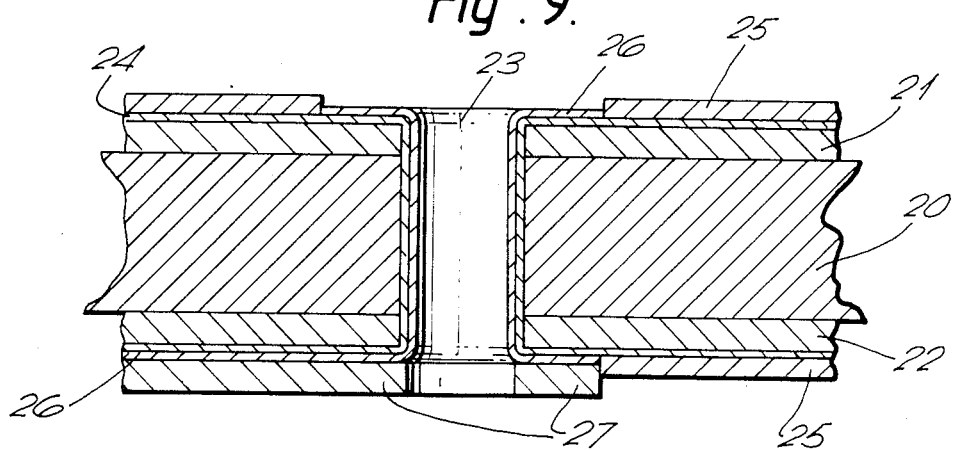
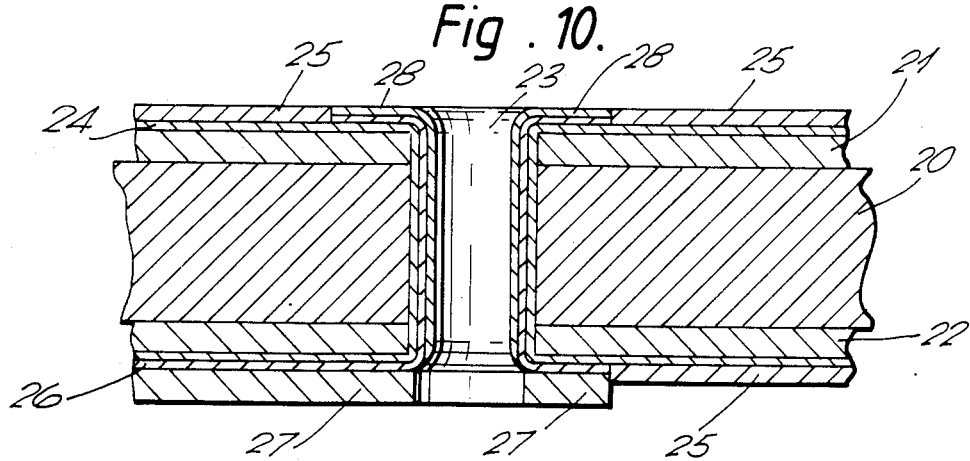

MANUFACTURE OF PRINTED CIRCUIT BOARDS

This invention relates to the manufacture of printed circuit boards of the type having plated-through holes interconnecting printed conductors formed on each of two external surfaces.

It is usual for the exposed conductive areas of printed circuit boards to be capable of taking solder, with the use of a conventional solder flux. This makes it possible to attach components to such areas, or to apply solder to bridge faults in a printed conductor. Many printed circuit boards have plated-through holes which interconnect conductors on both sides of a double-sided board or on the external surfaces of a multi-layer board. Frequently components are attached by inserting leads into such holes and soldering them in place. Since the interior of the hole is plated with conductive material, solder tends to fill the hole and flow onto the other side of the board, making the component very difficult to remove if this later becomes necessary.

It is an object of the invention to provide a method of manufacture of a printed circuit board in which the above-mentioned problem is overcome.

According to the present invention there is provided a method of manufacture of a printed circuit board having plated through holes interconnecting printed conductors formed on each of two external surfaces, which includes the steps of masking those areas of the external surfaces where solder will be required to adhere, coating unmasked conductive areas of the board with a material which prevents wetting by normal soldering techniques, and subsequently removing the masking material.

The expression "normal soldering techniques" is used to describe those techniques and materials in normal use. It does not include the use of special fluxes such as Baker's fluid which might damage the non-wetting coating.

Preferably the non-wetting coating is a layer of a metallic material, applied by electroplating or electroless techniques, which oxidises easily to provide a surface to which solder will not adhere and which is not damaged by normal soldering fluxes.

Figure 2:
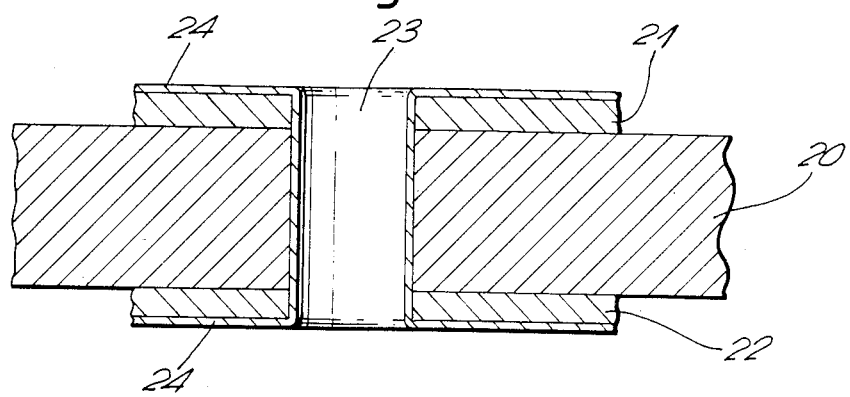

The invention will now be described with reference to the accompanying drawings, in which:

FIG. 1 shows a sectional view through a printed circuit board manufactured in accordance with the invention; and FIG. 2 illustrates the steps in the manufacture of such a board.

FIG. 1 shows a double-sided printed circuit board comprising a laminate 10 carrying conductor patterns 11 and 12 on its two surfaces. Interconnecting plated-through holes 13 are formed between conductors on opposite sides of the board. The pad 14 around a plated-through hole 13 on the side of the board which carries components 15, and the bore of the hole 14, have an additional non-wetting layer formed in the manner to be described below. The component is attached to the board by passing a component lead 16 through the hole 13 and applying solder 17 to the pad on the opposite side of the board from the component. Solder adheres to this pad, but not to the bore of the hole or to the pad on the component side of the board. As shown in the drawing a small amount of solder may be drawn into the hole, but this is easily removed using standard de-soldering equipment.

The non-wetting coating may be applied by electroplating or electroless techniques. The former gives a more satisfactory coating, but requires modification of the process used to manufacture the boards. One technique for forming board with the non-wetting coating is described below. The initial steps are those commonly used to manufacture boards with plated-through holes.

FIGS. 2 to 8 illustrate the essential steps in the manufacture of such a board, each showing a sectional side view of part of a board. The relative dimensions of the drawings are not necessarily to scale.

FIG. 2 shows part of a laminate 20, clad on each face with copper foils 21 and 22. A number of holes 23, of which one is shown, are drilled through the laminate and the foil layers. After the holes have been drilled the two surfaces of the board and the bores of the holes 23 are plated with a copper layer 24 to form continuous plating through the holes.

Figure 3:
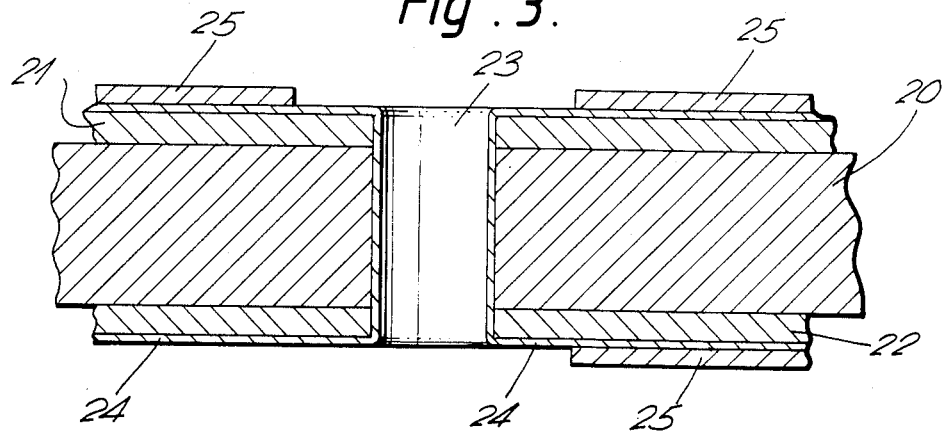

The next step, as shown in FIG. 3, is to produce a mask pattern 25 on the surfaces of the board by screen printing or photographic techniques. The areas masked are the areas of copper which are subsequently to be removed.

Figure 4:
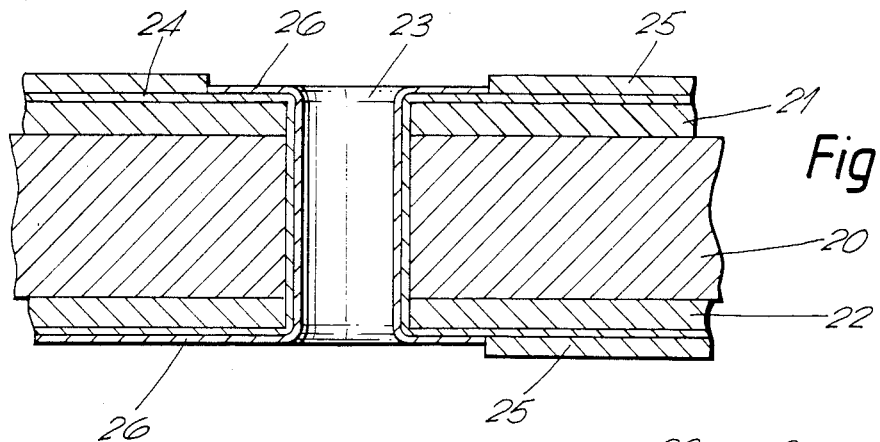

FIG. 4 shows the next step, namely the plating-on of a very thin layer of gold 26 over the exposed copper pattern which forms the required printed conductors.

The method so far described is part of the conventional method of manufacture of printed circuit boards having plated-through holes. The remaining steps differ somewhat, as will be described.

Figure 5:
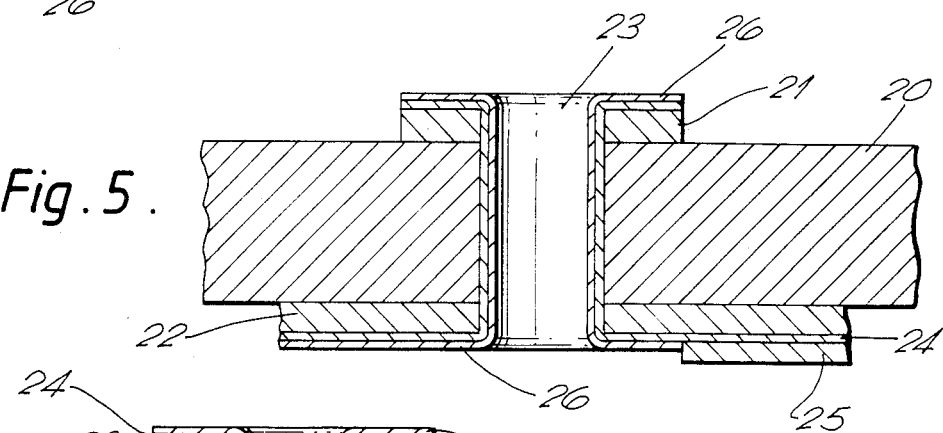

It will be remembered that one surface of the board will carry components, and that solder is not required to wet hole pads on that surface, or the bores of the holes. That surface is assumed to be the upper surface as seen in the drawings. The resist 25 and unwanted copper foil 21 is removed from that surface, leaving only the copper which has been protected by the gold layer 26. FIG. 5 shows the result, with the upper surface of the laminate 20 carrying the required pattern of printed conductors. The other surface still carries a complete copper foil 22, with the mask pattern 25 and the subsequent gold layer 26.

Figure 6:
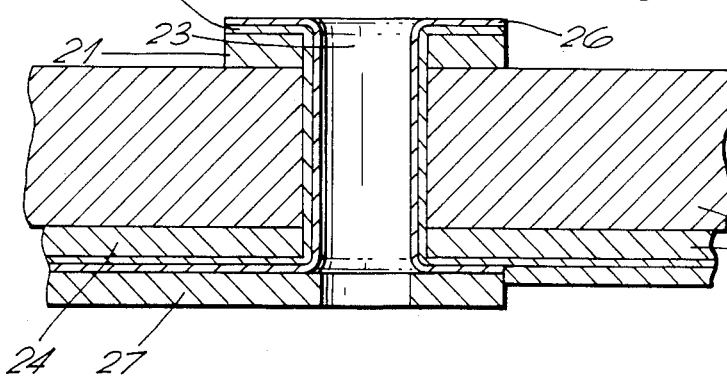
Figure 7:
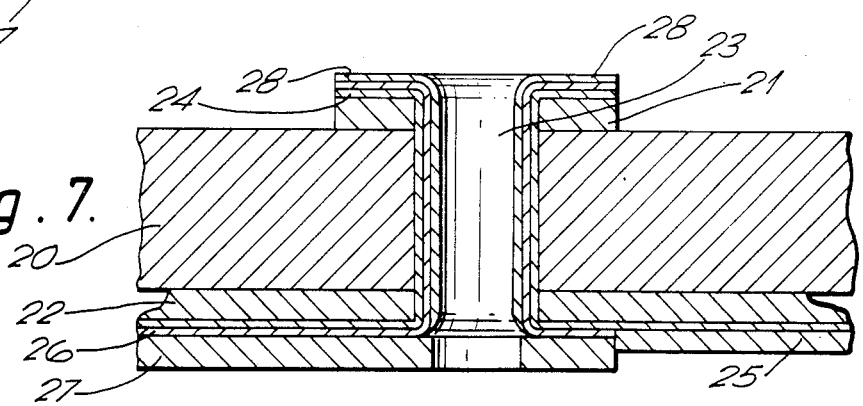

The next step is to form on the "lower" face a mask pattern covering those areas of the gold-plated surface where solder will subsequently be required to adhere. The mask 27 may cover the entire conductor pattern on that surface, as shown in FIG. 6, or may be restricted to the conductor areas immediately surrounding the plated-through holes.

Subsequent to this masking, the board is plated with a suitable non-wetting layer 28, using the still complete copper layer on the lower surface of the board as the electrical connection to ensure that all unmasked conductor areas are covered, including the bores of the holes 23. Suitable materials for the non-wetting layer are metal coating which readily oxidise or passivate in air, and include nickel, nickel-tin alloy or nickel-palladium alloy.

The final stage of the process is the removal of masking layers 25 and 27 and the unwanted copper layers 22 and 24 from the lower surface of the board, leaving only the required conductor pattern on that surface. The board is now ready for use. As already stated, the non-wetting coating of oxidised or passivated metal is sufficiently strong to prevent solder wetting in the usual soldering techniques.

The method of manufacture described above may be modified to avoid the selective etching of one side only described with reference to FIG. 5. Instead of doing this, the second mask used to define areas where solder is required to adhere may be formed on the appropriate areas of the unetched board. This is shown in FIG. 9, with the second mask indicated as before by the reference 27. The non-wetting coating is then electroplated as before onto all conductive areas not covered by either of the two masks. The result of this is shown in FIG. 10. The final stage in the process is the removal of both masks and the etching away of any copper not covered by either the gold layer or the non-wetting coating, leaving the completed board as shown in FIG. 8.

The modification of the normal manufacturing steps for a printed circuit board is necessary because it enables a satisfactory electrical connection to be made to all areas where the non-wetting coating is to be deposited. It is clearly very difficult to achieve this if using a ready-made circuit board with plated-through holes. It is, however, possible to apply the coating to completed board, using electroless plating of nickel. Hence the only steps necessary are to unmask the areas to which solder is to adhere, electrolessly plate the required coating, and then remove the mask. However, as is well known, electroless plating is rarely as satisfactory as electroplating.

No reference has been made to the composition of any of the plating materials used, or the materials used for masking. These are well known in the printed circuit field.

The example described above concerned a single double-sided printed circuit board. Similar techniques may be used with multi-layer boards.

Additional steps to include further conductive layers may be included in the process described above, and various cleaning stages have been omitted from the description.

What we claim is:

1. A method of manufacture of a printed circuit board adapted to have components soldered thereto and having plated through holes interconnecting printed conductors formed on each of two external surfaces, which enables ready removal of soldered components having portions thereof received in the plated through holes of the printed circuit board, said method including the steps of masking those areas of the external surfaces where solder will be required to adhere when a component is soldered to the printed circuit board, coating unmasked conductive areas with a material which prevents wetting by normal soldering techniques, and subsequently removing the masking material so that components can be soldered to the printed circuit board at the areas which were masked during said masking step, said areas which were masked during said masking step each being located on one of the surfaces of the printed circuit board adjacent to the periphery of the bore of a said plated through hole and said coating material being applied to the bore of the plated through holes whereby components which are soldered to the printing circuit board at the areas that were masked during said masking step and which have portions thereof received in said plated through holes can be readily removed.

2. A method as claimed in claim 1 in which the coating is an electroplated layer of nickel or a suitable nickel alloy.

3. A method as claimed in claim 1 in which the coating is applied after an etching of printed conductors on that external surface of a board to which the coating is to be applied, but before the etching of printed conductors on the other external surface of the board.

4. A method as claimed in claim 1 in which the coating is applied before an etching of printed conductors on either external surface of a board.

5. A method as claimed in claim 1 in which the coating is an electroless coating of nickel.

6. A method as claimed in claim 5 in which the coating is applied to a circuit board having printed conductors formed on both external surfaces.

7. A method as claimed in claim 1 wherein the coating is applied to one surface of the bore and is limited on that surface to an area around the periphery of the through holes.

* * * * *